(12) United States Patent
Kim et al.

(10) Patent No.: US 8,811,111 B2
(45) Date of Patent: Aug. 19, 2014

(54) MEMORY CONTROLLER WITH REDUCED POWER CONSUMPTION, MEMORY DEVICE, AND MEMORY SYSTEM

(75) Inventors: Si-hong Kim, Yongin-si (KR); Young-hyun Jun, Seoul (KR); Kwnag-Il Park, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 324 days.

(21) Appl. No.: 12/950,028

(22) Filed: Nov. 19, 2010

(65) Prior Publication Data
US 2011/0126039 A1  May 26, 2011

(30) Foreign Application Priority Data
Nov. 20, 2009 (KR) .................. 10-2009-0112814

(51) Int. Cl.
*G11C 8/18* (2006.01)
*G11C 7/22* (2006.01)

(52) U.S. Cl.
CPC ............... *G11C 7/225* (2013.01); *G11C 7/222* (2013.01); *G11C 7/22* (2013.01)
USPC ................... 365/233.11; 365/233.1; 365/203

(58) Field of Classification Search
USPC ................... 365/233.1–233.12, 203
See application file for complete search history.

(56) References Cited

U.S. PATENT DOCUMENTS

| 5,903,514 | A  | * | 5/1999  | Sawada ...................... 365/233.1 |
| 6,002,615 | A  | * | 12/1999 | Sawada .................... 365/189.15 |
| 6,608,795 | B2 | * | 8/2003  | Arimoto et al. .......... 365/230.03 |
| 7,852,687 | B2 | * | 12/2010 | Kim .......................... 365/189.12 |
| 7,889,595 | B2 | * | 2/2011  | Park .......................... 365/233.1 |
| 8,040,747 | B2 | * | 10/2011 | Hwang ........................ 365/203 |

* cited by examiner

*Primary Examiner* — Kretelia Graham
(74) *Attorney, Agent, or Firm* — F. Chau & Associates, LLC

(57) ABSTRACT

A memory device comprising: at least one bank of memory cells that receives a first clock for clocking commands and a second clock for clocking data, wherein the second clock is activated based on a first command and deactivated based on a second command. The memory device further including a clock activation circuit configured to generate an enable signal based on the first command and a disable signal based on the second command, and a clock generator configured to generate the second clock based on a reference clock upon receipt of the enable signal.

14 Claims, 13 Drawing Sheets

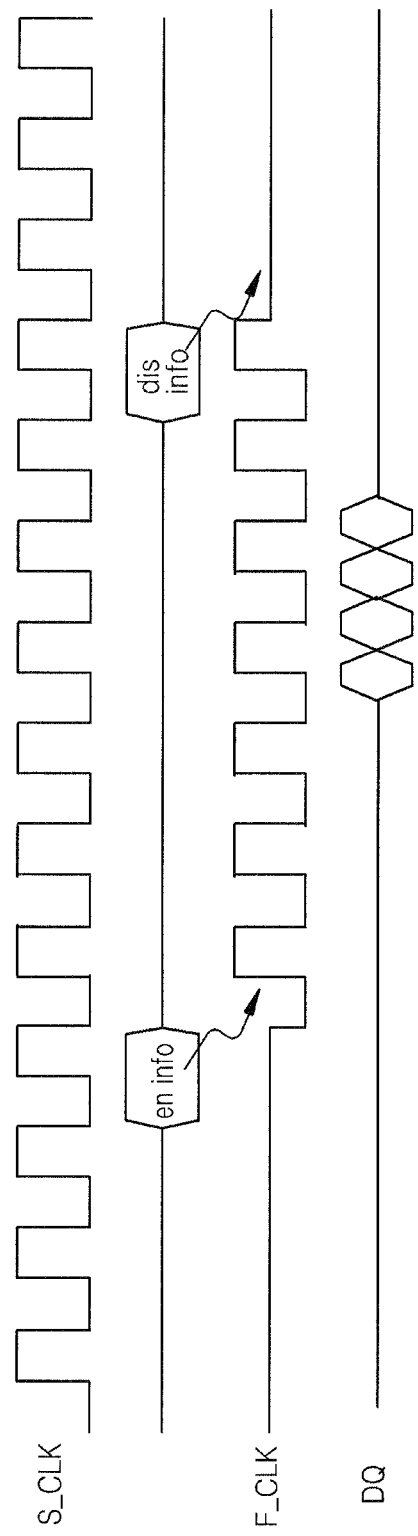

MEMORY CONTROLLER WITH REDUCED POWER CONSUMPTION, MEMORY DEVICE, AND MEMORY SYSTEM

CROSS-REFERENCE TO RELATED APPLICATIONS

This application claims priority under 35 USC Section 119 to Korean Patent Application No. 10-2009-0112814, filed on Nov. 20, 2009, in the Korean Intellectual Property Office, the disclosure of which is incorporated by reference herein in its entirety.

BACKGROUND

The inventive concept relates to a memory device, a memory system, and a method of clocking data.

Dynamic random access memories (DRAMs) are widely used in numerous applications including in personal computers or servers in computer systems. For high-performance and high-capacity, semiconductor memory devices such as DRAMs are mounted on a memory module, and the memory module is installed in a computer system.

A DRAM which operates in synchronization with a system clock, a clock signal of a system, is known as a synchronous semiconductor memory device (SDRAM). An SDRAM which transmits data in synchronization with rising and falling edges of a system clock signal is known as a double-data-rate (DDR) SDRAM A DDR2 SDRAM and a DDR3 SDRAM having improved operating speeds are successors to a DDR SDRAM. Memory access operations, such as write and read operations, of such semiconductor memory devices are controlled as the semiconductor memory devices communicate with a memory controller. For example, a semiconductor memory device may receive a write command, write data, and a clock signal from a memory controller, and provide read data and a clock signal to the memory controller during a read operation. Such clock signal from the memory controller operates synchronously with the system clock.

FIG. 1 is a block diagram of a conventional semiconductor memory system 10. Referring to FIG. 1, the conventional semiconductor memory system 10 may include a memory controller 11 and a memory module 12 having memory devices MEM1, ... MEMn. Although one memory module is illustrated in FIG. 1 for convenience of explanation, two or more memory modules may be included in the conventional semiconductor memory system 10.

The memory controller 11 and the memory module 12 transmit and receive signals through various buses located in the conventional semiconductor memory system 10. For example, the memory controller 11 may provide write data to the memory module 12 through a data bus Bus_DQ, or receive data read from the memory module 12 through the data bus Bus_DQ. Also, a clock signal or a data strobe signal may be transmitted between the memory controller 11 and the memory module 12 through other buses located in the conventional memory system 10. For example, a data strobe signal may be transmitted through a strobe bus Bus_strobe, and a system clock signal may be transmitted through a clock bus Bus_S_CLK, as shown in FIG. 1.

Each memory device receives data or a command/address signal provided from the memory controller 11. In general, a memory device receives a data signal in synchronization with a data strobe signal, and receives a command/address signal in synchronization with a system clock signal. When the data signal is received in synchronization with the data strobe signal, as described above, a timing margin may be reduced due to intersymbol interference (ISI) in the data strobe signal. The system clock signal, instead of the data strobe signal, may be used to synchronously receive the data signal without ISI issues, but power consumption increases with more prevalent use of the system clock.

SUMMARY

According to an embodiment of the present inventive concept, a memory device is provided, comprising: at least one bank of memory cells that receives a first clock for clocking commands and a second clock for clocking data, wherein the second clock is activated based on a first command and deactivated based on a second command, wherein the first command is a memory access command, and wherein the memory access command is one of Active, Bank Active, Write, or Read, and wherein the second command is Precharge.

According to another embodiment, the memory device further includes a clock activation circuit configured to generate an enable signal based on the first command and a disable signal based on the second command, and a clock generator configured to generate the second clock based on a system clock upon receipt of the enable signal, and disables the second clock upon receipt of the disable signal, and wherein the second clock is a passed-through version of a system clock. According to an embodiment, the memory device is a DRAM.

According to another embodiment, a memory access method is provided, comprising: receiving a first clock; receiving at a clock activation circuit a memory access command and generating an enable signal based on the memory access command; and generating a second clock based on the first clock for clocking data based on the enable signal; and generating a disable signal by the clock activation circuit to disable the second clock.

According to some embodiments, the second clock is disabled upon receipt of a Precharge command, and the memory access command is one of Active, Bank Active, Write, or Read.

According to some embodiments, the memory access method wherein said generating a second clock step is performed within a memory controller, and in other embodiments, said generating a second clock step is performed within a memory device, wherein the second clock is a passed-through version of the first clock.

According to some embodiments, a memory controller is provided, comprising: a memory interface configured to interface with a memory device including transmitting memory access commands to a memory device and transmitting data to be written and receiving data read from the memory device; a clock activation circuit configured to generate an enable signal based on a first memory access command and a disable signal based on a second command; a clock generator configured to generate a second clock that duplicates a first clock upon receipt of the enable signal, wherein the clock generator disables the second clock upon receipt of the disable signal, and wherein the second clock is used to clock data.

According to some embodiments, the memory access command is one of Active, Bank Active, or Write, and the second command is a Precharge command.

According to some embodiments, the first clock and the second clock is generated from a reference clock.

BRIEF DESCRIPTION OF THE DRAWINGS

Exemplary embodiments of the inventive concept will be more clearly understood from the following detailed description taken in conjunction with the accompanying drawings in which:

FIGS. 3A, 3B, and 3C are timing diagrams showing use of clock signals in a memory system according to an embodiment of the inventive concept;

DETAILED DESCRIPTION OF THE EMBODIMENTS

Figure 1:
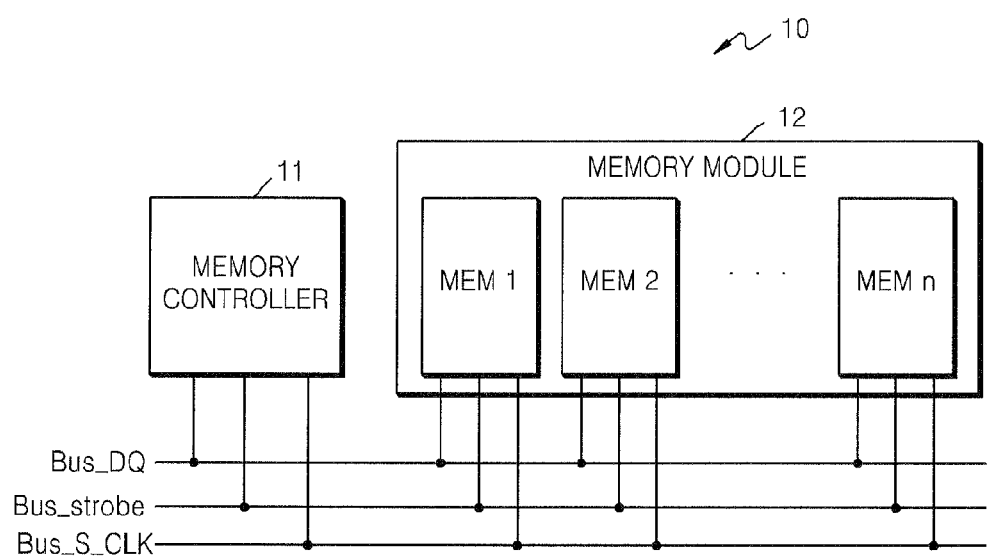
FIG. 1 is a block diagram of a conventional semiconductor memory system; *add PRIOR ART label

The inventive concept will now be described more fully with reference to the accompanying drawings, in which exemplary embodiments of the inventive concept are shown. In the drawings, the same reference numerals denote the same elements.

Figure 2A:
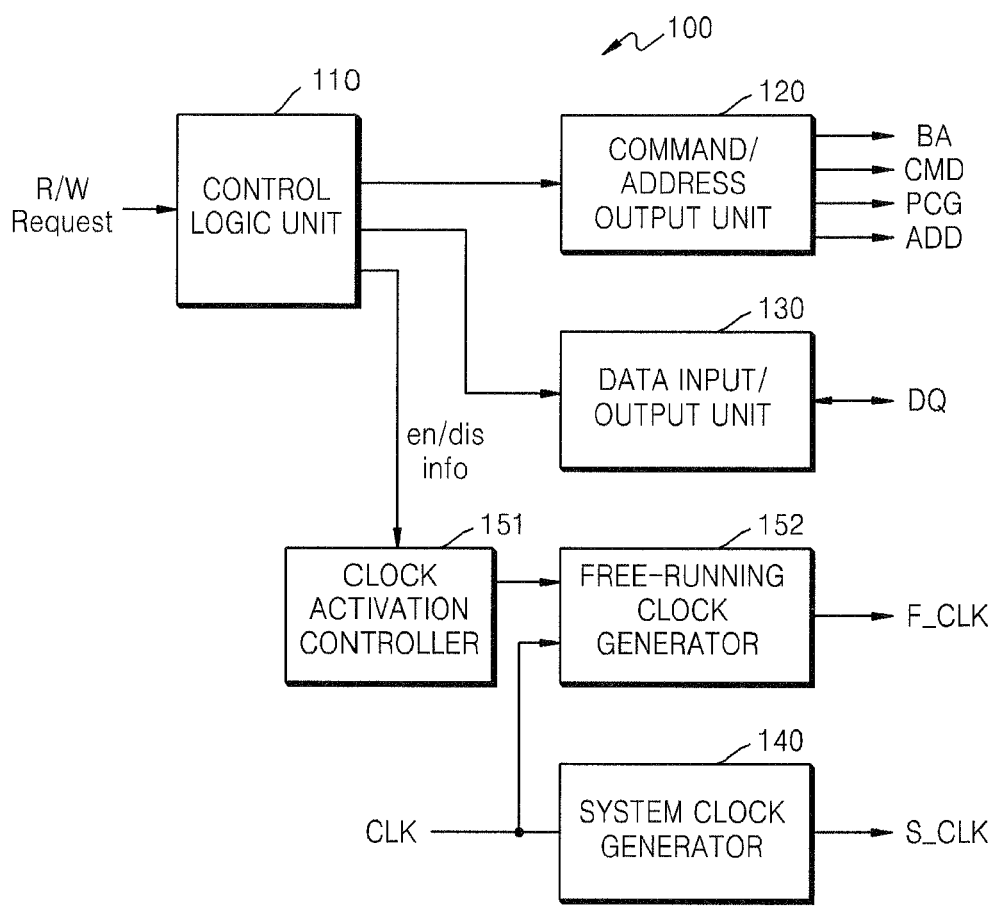
FIG. 2A is a block diagram illustrating a memory controller according to an embodiment of the inventive concept.

FIG. 2A is a block diagram illustrating a memory controller 100 according to an embodiment of the inventive concept. Referring to FIG. 2A, the memory controller 100 may include a control logic unit 110, a command/address output unit 120, and a data input/output unit 130. Also, the memory controller 100 may generate at least one clock signal and provide the at least one clock signal to a memory device (not shown). Accordingly, the memory controller 100 may further include a system clock generator 140, a clock activation controller 151, and a free-running clock generator 152.

The control logic unit 110 receives read/write (R/W) request signals, controls the overall operation of elements in the memory controller 100, and generates internal command/address signals and an internal write data signal (not shown) to provide a plurality of command signals and an address signal to the memory device or provide a write data signal to the memory device. The command/address output unit 120 receives the internal command/address signals, and provides various command signals BA, CMD, and PCG, and an address signal ADD to the memory device. Also, the data input/output unit 130 receives a write data signal written to the memory device, and provides a write data signal DQ to the memory device. Although not shown in FIG. 2A, the control logic unit 110 may directly generate the various command signals BA, CMD, and PCG, the address signal ADD, and the write data signal, and in such case, the command/address output unit 120 and the data input/output unit 130 may be omitted or may perform only a general signal input/output operation, e.g., a buffering operation.

The memory controller 100 generates at least one clock signal. For example, as shown in FIG. 2A, the memory controller 100 may generate a system clock signal S_CLK and provides the system clock signal S_CLK to the memory device, and also generates a free-running clock signal F_CLK and provides the free-running clock signal F_CLK to the memory device. The system clock generator 140 may generate the system clock signal S_CLK by using a reference clock signal CLK. Alternatively, the system clock generator 140 may provide (i.e., pass-through) the reference clock signal CLK as a system clock signal to the memory device. The memory device receives the command/address signals BA, CMD, ADD, and PCG provided from the memory controller 100 in synchronization with the system clock signal S_CLK, and also receives the data signal DQ provided from the memory controller 100 in synchronization with the free-running clock signal F_CLK.

The free-running clock signal F_CLK may be generated by maintaining an active state for a predetermined period of time by using information from the control logic unit 110. An operation of controlling activation of the free-running clock signal F_CLK may be performed by using information about the generation of internal command or various command signals generated in the control logic unit 110. The clock activation controller 151 receives enabling or disabling information (en/dis info) in connection with the generation of internal command or command signals from the control logic unit 110, and controls the free-running clock generator 152 in response to the received information en/dis info. The free-running clock generator 152 may be activated or inactivated to output the free-running clock signal F_CLK under the control of the clock activation controller 151. Although the clock activation controller 151 receives the information en/dis info about the generation of the internal command or command signals in FIG. 2A, the clock activation control unit 151 may directly receive the internal command or command signals.

The memory controller 100 controls write and read operations for a plurality of memory banks included in the memory device, and includes state information, e.g., information about an active state or a precharge state, of the plurality of memory banks. For example, during a write operation, the memory controller 100 generates a bank active command signal BA for activating at least one memory bank. Also, when a write operation for the at least one memory bank is finished, a precharge command signal PCG is generated to perform a precharge operation on memory banks wherein the write operation has been performed.

The free-running clock generator 152 may generate a free-running clock signal F_CLK by using a clock signal in the memory controller 100. For example, the free-running clock signal 152 may generate the free-running clock signal F_CLK by using a reference clock signal CLK. Also, under the control of the clock activation controller 151, the free-running clock signal F_CLK may be generated by activating or inactivating the reference clock signal CLK. An operation of generating the free-running clock signal F_CLK will be explained in further detail with reference to FIGS. 2B, 2C, and 2D.

Figure 2B:
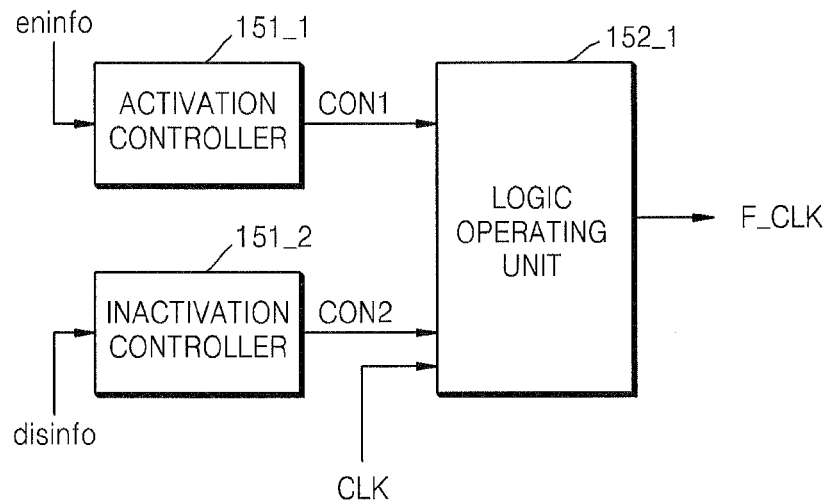
FIGS. 2B, 2C, and 2D are block diagrams illustrating a clock activation controller and a free-running clock generator according to an embodiment of the inventive concept.
Figure 2C:
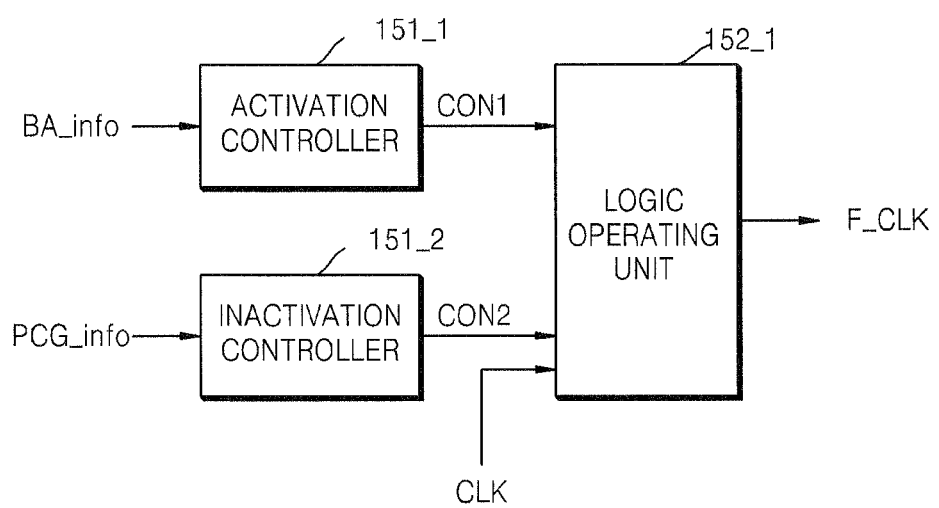
Figure 2D:
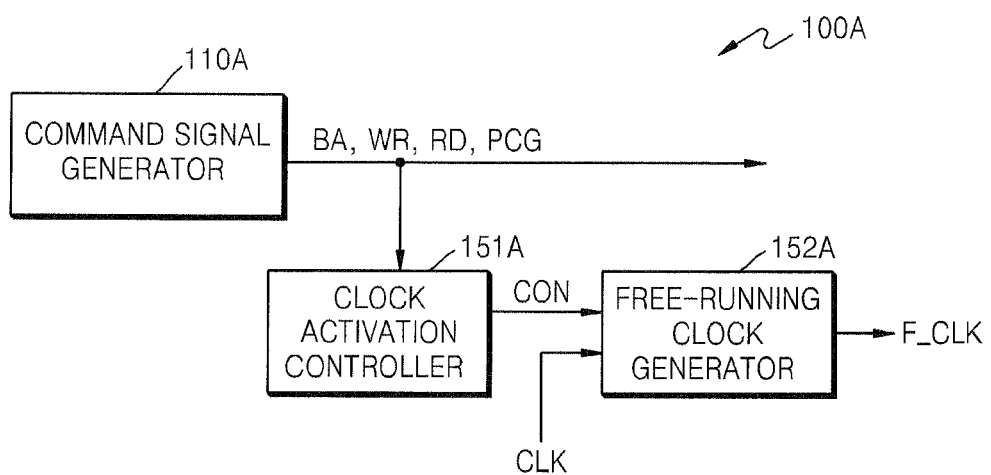

FIGS. 2B, 2C, and 2D are block diagrams illustrating the clock activation controller 151 and the free-running clock generator 152 of FIG. 2A, according to an embodiment of the inventive concept. The clock activation controller 151 receives a plurality of command signals or information related to the generation of the command signals from the control logic unit 110. If a first command signal from among the plurality of command signals is generated, the clock activation controller 151 receives first information en info about the generation of the first command signal, and generates a first control signal CON1. Also, if a second command signal from among the plurality of command signals is generated from the control logic unit 110, the clock activation controller 151 receives second information dis info about the generation of the second command signal, and generates a second control signal CON2. To this end, the clock activation controller 151 may include an activation controller 151_1 and an inactivation controller 151_2.

The free-running clock generator 152 may include a logic operation unit 152_1. The logic operation unit 152_1 receives the first and second control signals CON1 and CON2, and generates a free-running clock signal F_CLK by using the first and second control signals CON1 and CON2. For example, if a first command signal is generated from the control logic unit 110, the logic operation unit 152_1 activates a reference clock signal CLK in response to a first control signal CON1. Also, if a second command signal is generated from the control logic unit 110, the logic operation unit 152_1 inactivates the reference clock signal CLK in response to a second control signal CON2. Accordingly, the logic operation unit 152_1 generates a free-running clock signal F_CLK including clocks activated for a predetermined period of time, and provides the free-running clock signal F_CLK to the memory device.

Each of the first command signal for activating the free-running clock signal F_CLK and the second command signal for inactivating the free-running clock signal F_CLK may be any one of a plurality of command signals generated from the control logic unit 110. For example, if data is written to the memory device, the memory controller 100 may generate a bank active command signal BA for activating memory banks included in the memory device, a write command signal for commanding a write operation, and a precharge command signal PCG for performing a precharge operation when a write operation for the memory banks is finished. The above command signals are generated at predetermined time intervals, and are sequentially generated from the memory controller 100. One of the command signals is used as information for activating the free-running clock signal F_CLK, and another one is used as information for inactivating the free-running clock signal F_CLK, so as to generate the free-running clock signal F_CLK including clocks activated for a predetermined period of time.

FIG. 2C illustrates a case where a bank active command signal BA is used as a first command signal and a precharge command signal PCG is used as a second command signal.

During a write operation, the control logic unit 110 generates an active command signal for activating at least one memory bank from among a plurality of memory banks. Also, the control logic unit 110 generates first information BA_info about the generation of the active command signal and provides the first information BA_info to the activation controller 151_1. The activation controller 151_1 generates a first control signal CON1 in response to the first information BA_info, and the logic operation unit 152_1 activates a free-running clock signal F_CLK in response to the first control signal CON1.

Meanwhile, to perform a precharge operation on memory banks on which the write operation is finished, the control logic unit 110 generates a precharge command signal. Also, the control logic unit 110 generates second information PCG_info about the generation of the precharge command signal and provides the second information PCG_info to the inactivation controller 151_2. The inactivation controller 151_2 generates a second control signal CON2 in response to the second information PCG_info, and the logic operation unit 152_1 inactivates the free-running clock signal F_CLK in response to the second control signal CON2.

If a plurality of memory banks are included in the memory device, the control logic unit 110 may have state information, e.g., information about an active state or a precharge state, of all of the memory banks included in the memory device. To inactivate the free-running clock signal F_CLK, the control logic unit 110 determines whether all of the memory banks included in the memory device are in a precharge state. If it is determined that all of the memory banks are in a precharge state, the control logic unit 110 may generate the second information PCG_info as well as generating the precharge command signal, and may provide the second information PCG_info to the inactivation controller 151_2.

The logic operation unit 152_1 receives a reference clock signal CLK, and activates or inactivates the reference clock signal CLK. The logic operation unit 152_1 activates and outputs the reference clock signal CLK in response to the first control signal CON1 that is activated. That is, the logic operation unit 152_1 generates the free-running clock signal F_CLK that is activated in synchronization with the bank active command signal. The logic operation unit 152_1 maintains an active state of the free-running clock signal F_CLK and outputs the free-running clock signal F_CLK until a precharge command signal is generated from the memory controller 100.

For a memory access operation, a write command signal, an address signal, and write data for writing data are provided from the memory controller 100 to the memory device. As described above, the memory device may receive the write command and address signals in synchronization with the system clock signal S_CLK. Also, the memory device receives the write data in synchronization with the free-running clock signal F_CLK that is in an active state.

When the write operation on the memory banks included in the memory device is finished, to perform a precharge operation on the memory device, a precharge command signal is generated from the memory controller 100. Second information PCG_info about the generation of the precharge command signal is provided to the inactivation controller 151_2. The inactivation controller 151_2 generates a second control signal CON2 in response to the second information PCG_info.

The logic operation unit 152_1 inactivates and outputs the reference clock signal CLK in response to the second control signal CON2. That is, the logic operation unit 152_1 generates the free-running clock signal F_CLK that is activated in synchronization with the bank active command signal and maintains an active state for a predetermined period of time, and the free-running clock signal F_CLK is inactivated in synchronization with the precharge command signal.

FIG. 2D illustrates an operation of generating a free-running clock signal F_CLK according to another embodiment of the inventive concept. As described above, to control an active period of the free-running clock signal F_CLK, a generation timing of a command signal provided to the memory device from the memory controller is used. A memory controller 100A illustrated in FIG. 2D may include a command signal generator 110A, a clock activation controller 151A, and a free-running clock generator 152A.

A command signal generator 110A generates various command signals to be provided to the memory device. For example, the command signal generator 110A may generate a bank active command BA, a write command WR, a read command RD, and a precharge command PCG, and provide the bank active command BA, the write command WR, the read command RD, and the precharge command PCG to the memory device.

The clock activation controller 151A detects the various command signals generated in the command signal generator 110A, and generates at least one control signal CON based on the detected command signals. The free-running clock generator 152A generates a free-running clock signal F_CLK that is activated or inactivated in synchronization with the various command signals. For example, if a bank active command BA is generated from the command signal generator 110A, the clock activation controller 151A determines whether at least one memory bank is in an active state, and provides the control signal CON of a first state to the free-running clock generator 152A according to such determination. The free-running clock generator 152A receives a reference clock signal CLK, and maintains the reference clock signal CLK in an active state. Once the control signal CON of the first state is provided to the free-running clock generator 152A, the free-running clock generator 152A generates the free-running clock signal F_CLK, for example, bypassing the reference clock signal CLK to become the free-running clock signal F_CLK. According to some embodiments, the reference clock signal CLK may be derived from, and therefore synchronized with, the system clock.

When the clock activation controller 151A detects the generation of a precharge command PCG from the command signal generator 110A, it provides the control signal CON of a second state to the free-running clock generator 152A. If a plurality of memory banks are included in the memory device, it may be determined whether all of the memory banks are in a precharge state. If all of the memory banks are in a precharge state, the control signal CON of the second state may be generated. The free-running clock generator 152A maintains running the free-running clock F_CLK until the control signal CON of the second state is provided. Once the control signal CON of the second state is provided to the free-running clock generator 152A, the free-running clock generator 152A inactivates the free-running clock signal F_CLK.

Figure 3B:
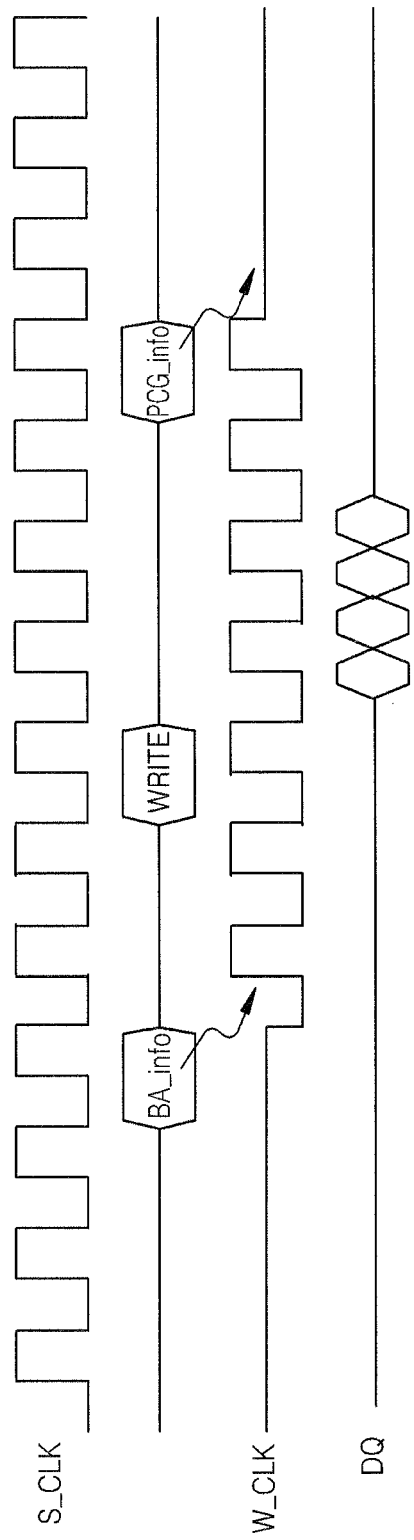
Figure 3C:
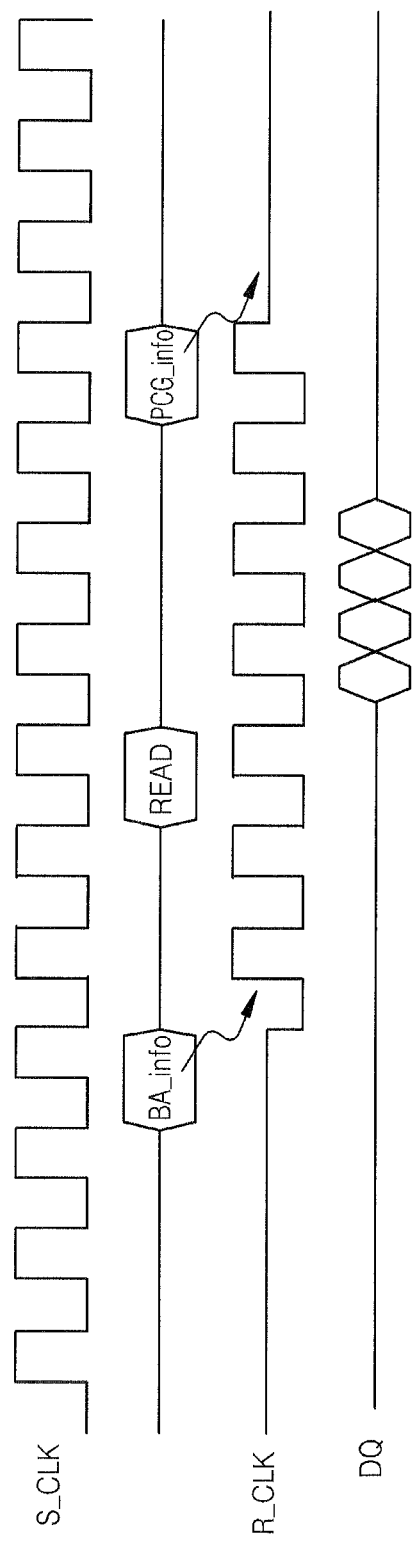

FIGS. 3A, 3B, and 3C are timing waveforms of the various dock signals described in connection with FIGS. 2A, 2B, 2C, and 2D, wherein free-running clock signal F_CLK, write clock signal W_CLK, and read clock signal R_CLK have the same magnitudes and periods, and are therefore respective duplicates of system clock signal S_CLK. Referring to FIG. 3A, a system clock signal S_CLK has a constant period, and is provided from the memory controller to the memory device. Also, the memory device receives various command signals and address signals in synchronization with the system clock signal S_CLK.

If first information en info in connection with a first control signal is generated from the memory controller, a free-running clock signal F_CLK is activated in synchronization with the first information en info. Next, if second information dis info in connection with a second command signal is generated from the memory controller, the free-running clock signal F_CLK is inactivated in synchronization with the second information dis info. Accordingly, the free-running clock signal F_CLK is activated for a duration between a time when the first information en info is generated and a time when the second information dis info is generated. In this case, instead of a data strobe signal, the free-running clock signal F_CLK may be used to transmit a data signal.

FIG. 3B illustrates waveforms of clock signals used during a write operation for writing data. Referring to FIG. 3B, a system clock signal S_CLK has a constant period like that in FIG. 3A, and may be provided from the memory controller to the memory device. During a write operation, a bank active command signal for activating memory banks on which the write operation is to be performed is generated. Before a bank active command is generated, a free-running write clock signal W_CLK is maintained in an inactive state. And, if first information BA_info is generated when the bank active command signal is generated, the free-running write clock signal W_CLK is activated in synchronization with the first information BA_info and is provided to the memory device. Next, a write command and write data are provided to the memory device. The free-running write clock signal W_CLK is maintained in an active state while the write data is provided. The memory device receives the write data in synchronization with the free-running write clock signal W_CLK. Next, if the write operation is finished and second information PCG_info is generated when a precharge command is generated, the free-running write clock signal W_CLK is inactivated in synchronization with the second information PCG_info.

FIG. 3C illustrate waveforms of clock signals used during a read operation for reading data. Referring to FIG. 3C, a system clock signal S_CLK has a constant period like that in FIGS. 3A and 3B, and may be provided from the memory controller to the memory device. The memory device performs a read operation in response to a read command signal output from the memory controller. The memory device may provide read data to the memory controller, and also generate a free-running READ clock signal R_CLK synchronized with the read data and provide the free-running READ clock signal R_CLK to the memory controller. The free-running READ clock signal R_CLK is a signal that is maintained in an active state at least during a period when the read data is transmitted, and the memory controller receives the read data in synchronization with the free-running READ clock signal R_CLK.

According to the present embodiment, the free-running READ clock signal R_CLK for the read data may be generated in the memory device. To read data stored in a memory bank, the memory controller provides a bank active command signal for activating at least one memory bank to the memory device. The control logic unit (not shown) included in the memory device receives the bank active command signal, and activates the free-running READ clock signal R_CLK. Next, a read operation is performed, and the memory device provides the read data and the activated free-running READ clock signal R_CLK to the memory controller.

When the read operation for the memory bank is finished, to perform a precharge operation on memory banks, the memory controller provides a precharge command signal to the memory device. The control logic unit in the memory device receives the precharge command signal and inactivates the free-running clock signal. As described above, if a plurality of memory banks are included in the memory device, the control logic unit determines the states of the plurality of memory banks, and if it is determined that all of the memory banks are in a precharge state, the control logic unit may inactivate the free-running clock signal.

Figure 4A:
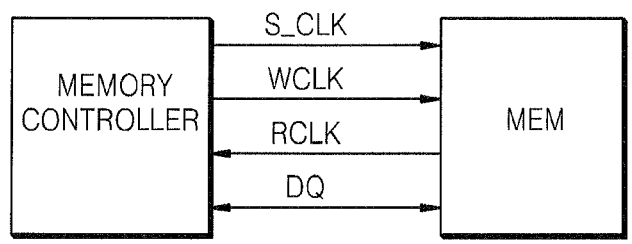
FIGS. 4A, 4B, and 4C are block diagrams for explaining signal transmission between a memory controller and a memory device in a memory system, according to an embodiment of the inventive concept.
Figure 4B:
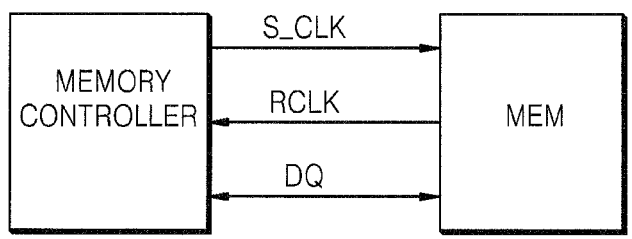
Figure 4C:
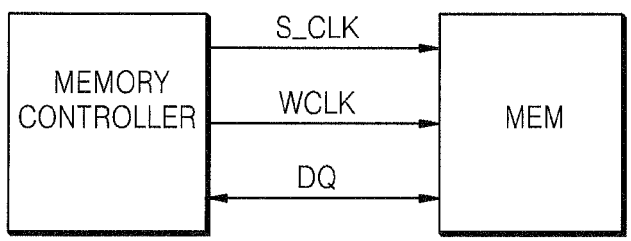

FIGS. 4A, 4B, and 4C are block diagrams for explaining signal transmission between a memory controller and a memory device in a memory system, according to an embodiment of the inventive concept. Referring to FIG. 4A, the memory controller and the memory device transmit and receive a system clock signal S_CLK, a write clock signal WCLK, a read clock signal RCLK, and data DQ to and from each other. The memory controller provides a system clock signal S_CLK to the memory device, and the memory device receives a command/address signal in synchronization with the system clock signal S_CLK. Also, the memory device may generate other clock signals by using the system clock signal S_CLK therein, and may use the other clock signals during a memory operation. Also, during a write operation, the memory controller may generate a free-running clock signal, which is activated during a predetermined period of time, and provide the free-running clock signal as a write clock signal WCLK to the memory device. The memory device receives write data in synchronization with the write clock signal WCLK.

During a read operation, the memory device may provide read data to the memory controller, and at the same time, may generate a read clock signal RCLK synchronized with the read data and provide the read clock signal RCLK to the memory controller. The memory device may generate a free-running clock signal, which is activated for a predetermined period of time, and may provide the free-running clock signal as a read clock signal RCLK to the memory controller. The memory controller receives read data in response to the read clock signal RCLK.

As described above, the write clock signal WCLK and the read clock signal RCLK used to transmit data may be generated by activating a free-running clock signal for a predetermined period of time. The memory system of FIG. 3 may perform a read or write operation by using only one of the write clock signal WCLK and the read clock signal RCLK generated, or may perform write and read operations by using the write clock signal WCLK and the read clock signal RCLK.

Referring to FIG. 4B, if the memory controller provides a system clock signal S_CLK to the memory device, the memory device receives a command/address signal and write data in synchronization with the system clock signal S_CLK. Meanwhile, during a read operation, the memory device provides a free-running clock signal, which is activated for a predetermined period of time, as a read clock signal RCLK to the memory controller, and the memory controller receives read data in synchronization with the read clock signal RCLK. Meanwhile, referring to FIG. 4C, if the memory controller provides a system clock signal S_CLK and a write clock signal WCLK to the memory device, the memory device receives a command/address signal in synchronization with the system clock signal S_CLK, and receives write data in synchronization with the write clock signal WCLK. Meanwhile, during a read operation, the memory controller may receive read data by using a system clock signal S_CLK generated therein.

Figure 5:
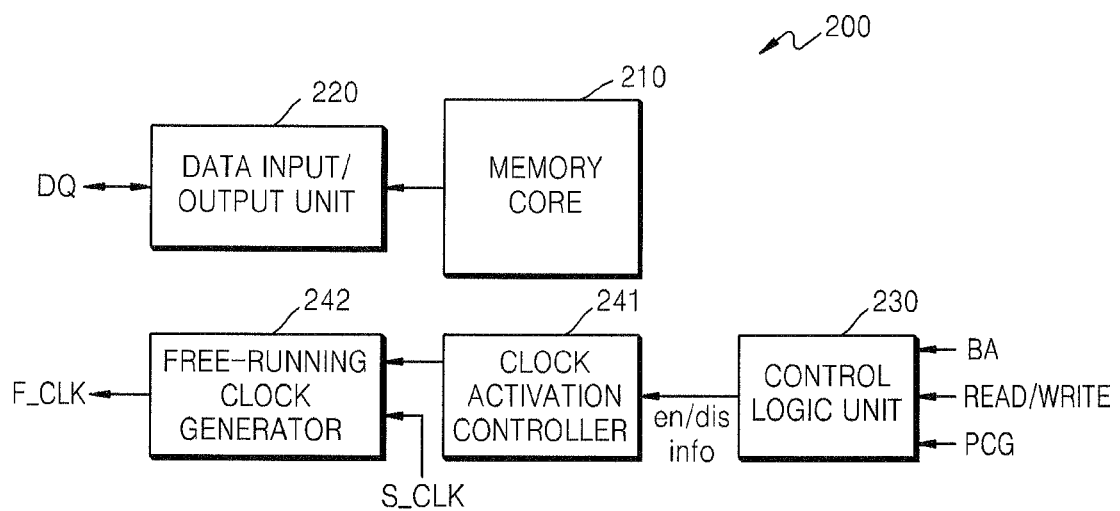
FIG. 5 is a block diagram illustrating a memory device according to an embodiment of the inventive concept.

FIG. 5 is a block diagram illustrating a memory device 200 according to an embodiment of the inventive concept. Referring to FIG. 5, the memory device 200 may include a memory core 210 for storing data, a data input/output unit 220 for transmitting/receiving data with a memory controller (not shown), and a control logic unit 230 for controlling the overall operation of the memory device 200. Also, to provide a clock signal related to read data, the memory device 200 may further include a clock activation controller 241 for generating a control signal in response to at least one information en/dis info output from the control logic unit 230, and a free-running clock generator 242 for generating a free-running clock signal F_CLK activated for a predetermined period of time under the control of the clock activation controller 241.

During a read operation, the memory device 200 receives a bank active command signal, a write command signal, an address signal, and so on from the memory controller. If data stored in the memory core 210 is read, read data DQ is provided to the memory controller through the data input/output unit 220. The free-running clock generator 242 generates a free-running clock signal F_CLK and provides the free-running clock signal F_CLK along with the read data DQ to the memory controller. The free-running clock signal F_CLK may be generated by using a predetermined clock signal. For example, in FIG. 5, the free-running clock signal F_CLK is generated by using a system clock signal S_CLK.

The control logic unit 230 controls the overall operation of the memory device 200 by using various command signals output from the memory controller, including bank active command signal BA, read/write command signal R/W and precharge command signal PCG. Also, to generate the free-running clock signal F_CLK that is activated at least for a predetermined period of time when read data is transmitted, the control logic unit 230 generates at least one information en/dis info by referring to the various command signals output from the memory controller. For example, if a bank active command signal BA is provided from the memory controller, the control logic unit 230 generates first information en info in response to the bank active command signal BA, and provides the first information en info to the clock activation controller 241. When a precharge command signal is provided from the memory controller, second information dis info is generated in response to the precharge command signal, and is provided to the clock activation controller 241.

The clock activation controller 241 generates at least one control signal in response to the first information en info and the second information dis info, and provides the at least one control signal to the free-running clock generator 242. The free-running clock generator 242 activates a system clock signal S_CLK in response to a control signal corresponding to the first information en info, and inactivates the system clock signal S_CLK in response to a control signal corresponding to the second information dis info. Accordingly, the free-running clock generator 242 generates the free-running clock signal F_CL, which is activated for a predetermined period of time, and provides the free-running clock signal F_CLK as a read clock signal to the memory controller.

Figure 6A:
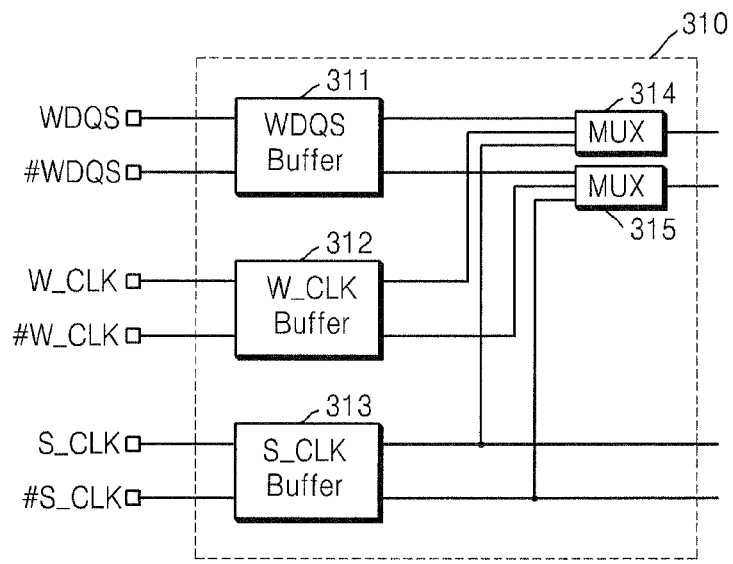
FIGS. 6A and 6B are block diagrams illustrating configurations of a memory device according to embodiments of the inventive concept.
Figure 6B:
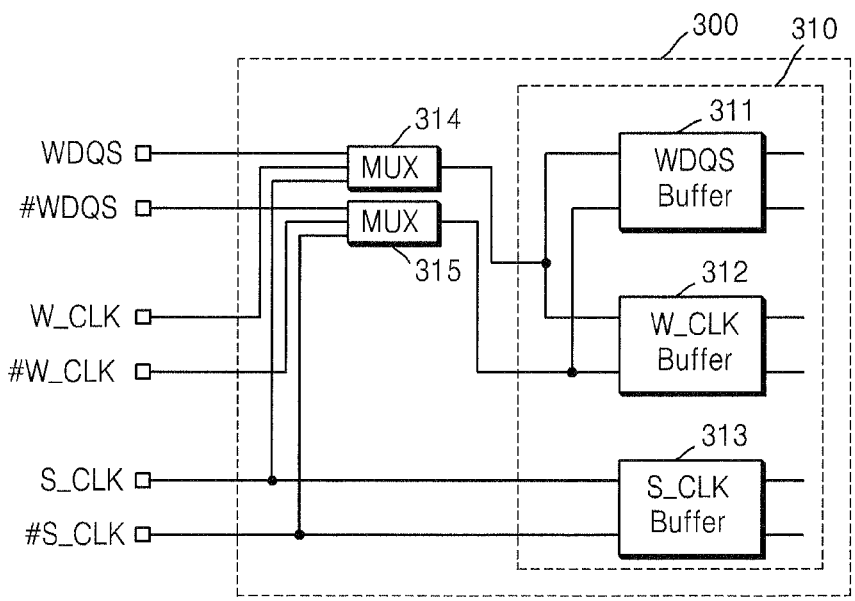

FIGS. 6A and 6B are block diagrams illustrating configurations of a memory device 310 according to embodiments of the inventive concept. Referring to FIG. 6A, the memory device 310 may include buffers 311, 312, and 313 for storing various clock signals provided from a memory controller (not shown). Also, the memory device 310 may further include multiplexers 314 and 315 for multiplexing and outputting clock signals provided from the buffers 311, 312, and 313.

Various clock signals provided from the memory controller may include write data strobe signals WDQS and #WDQS, write clock signals W_CLK and #W_CLK, and system clock signals S_CLK and #S_CLK. The write clock signals WDQS and #WDQS may be free-running clock signals which are activated for a predetermined period of time as described above. The multiplexers 314 and 315 multiplex the write data strobe signals WDQS and #WDQS, the write clock signals W_CLK and #W_CLK, and the system clock signals S_CLK and #S_CLK, and selectively output any one of the clock signals. The memory device 310 receives write data in synchronization with the clock signals output from the multiplexers 314 and 315. Since the system clock signals S_CLK and #S_CLK may be used during other operations of the memory device 310 than an operation for receiving write data, the system clock signals S_CLK and #S_CLK may be provided into the memory device 310 through a separate transmission line.

FIG. 6B illustrates an embodiment wherein a multiplexer for multiplexing write data strobe signals WDQS and #WDQS, write clock signals W_CLK and #W_CLK, and system clock signals S_CLK and #S_CLK is located outside the memory device 310. Referring to FIG. 6B, a memory module 300 may include at least one memory device 310. The memory device 310 includes the buffers 311, 312, and 313 for storing various clock signals provided from the memory controller. Meanwhile, the multiplexers 314 and 315 for multiplexing the write data strobe signals WDQS and #WDQS, the write clock signals W_CLK and #W_CLK, and the system clock signals S_CLK and #S_CLK may be located outside the memory device 310, for example, on a module board, of the memory module 300. If the write data strobe signals WDQS and #WDQS are selected by the multiplexers 314 and 315, the selected write data strobe signals WDQS and #WDQS may be stored in the write clock signal buffer 312 in the memory device 310. Also, if the write clock signals W_CLK and #W_CLK are selected by the multiplexers 314 and 315, the selected write clock signals W_CLK and #W_CLK may be stored in the write clock signal buffer 312 in the memory device 310.

When the system clock signals S_CLK and #S_CLK are selected by the multiplexers 314 and 315, the selected system clock signals S_CLK and #S_CLK may be stored in any one of the write data strobe signal buffer 311 and the write clock signal buffer 312. The system clock signals S_CLK and #S_CLK stored in the write data strobe signal buffer 311 or the write clock signal buffer 312 are used to receive write data. Meanwhile, since the system clock signals S_CLK and #S_CLK may be used during other operations of the memory device 310 than an operation for receiving the write data, the system clock signals S_CLK and #S_CLK are provided to the system clock signal buffer 313 through a separate transmission line.

An operation of selecting any one from among the clock signals may be performed in various manners. For example, if write clock signals W_CLK and #W_CLK are used as free-running clock signals activated only for a period when write data is provided as shown in FIGS. 6A and 6B, the multiplexers 314 and 315 may select and output the write clock signals W_CLK and #W_CLK, not write data strobe signals WDQS and #WDQS. The activities of the multiplexers 314 and 315 may be made by metal routing, and the operation of selecting the clock signal may be performed by connecting or disconnecting an electrical fuse. Also, a mode register set (MRS) signal may be used as a control signal for the operation of selecting the clock signal. For example, the electrical fuse may be controlled to be connected or disconnected by providing the MRS signal to the electrical fuse.

Figure 7A:
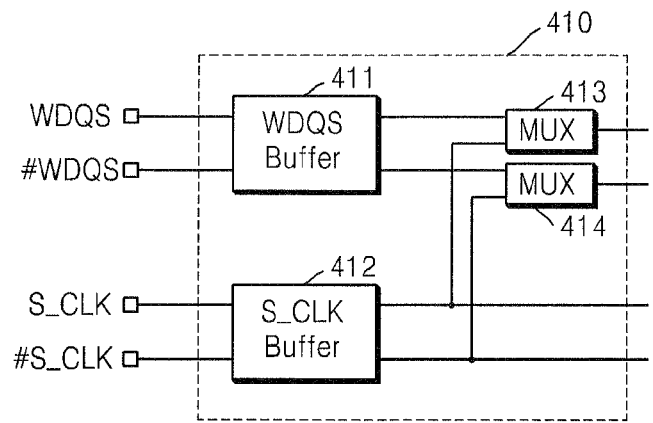
FIGS. 7A and 7B are block diagrams illustrating configurations of a memory device according to other embodiments of the inventive concept.
Figure 7B:
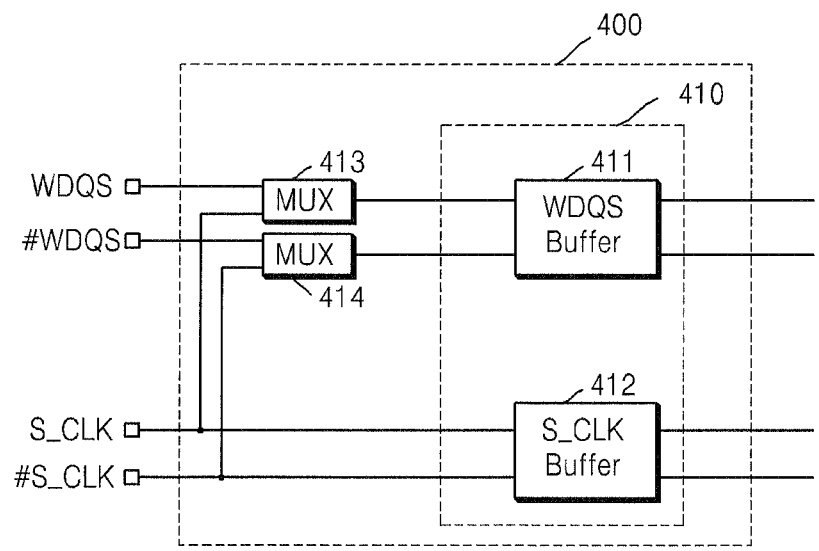

FIGS. 7A and 7B are block diagrams illustrating configurations of a memory device 410 according to another embodiment of the inventive concept. Referring to FIG. 7A, the memory device 410 may include buffers 411 and 412 for storing various clock signals provided from a memory controller (not shown), and multiplexers 413 and 414 for multiplexing clock signals provided from the buffers 411 and 412.

The memory device 410 of FIG. 7A may selectively use any one of data strobe signals WDQS and #WDQS and system clock signals S_CLK and #S_CLK as clock signals for receiving write data. The data strobe signals WDQS and #WDQS provided from the memory controller are stored in the data strobe signal buffer 411, and the system clock signals S_CLK and #S_CLK provided from the memory controller are stored in the system clock signal buffer 412). The multiplexers 413 and 414 receive the data strobe signals WDQS and #WDQS and the system clock signals S_CLK and #S_CLK, and selectively output any one of the clock signals. The memory device 410 receives write data provided from the memory controller in synchronization with the clock signals output from the multiplexers 413 and 414.

FIG. 7B illustrates a case where a multiplexer for multiplexing write data strobe signals WDQS and #WDQS and system clock signals S_CLK and #S_CLK is located outside the memory device 410 and in front of the write data strobe signal buffer 411. Referring to FIG. 7B, a memory module 400 may include at least one memory device 410, and also include the multiplexers 413 and 414 located outside the memory device 410. The multiplexers 413 and 414 receive data strobe signals WDQS and #WDQS and system clock signals S_CLK and #S_CLK provided from the memory controller, and selectively provide any one of the clock signals to the memory device 410. For example, the multiplexers 413 and 414 select any one of the data strobe signals WDQS and #WDQS and the system clock signals S_CLK and #S_CLK and provide the same to the data strobe signal buffer 411, and the data strobe signals WDQS and #WDQS or the system clock signals S_CLK and #S_CLK stored in the data strobe signal buffer 411 are used to receive write data.

Figure 8A:
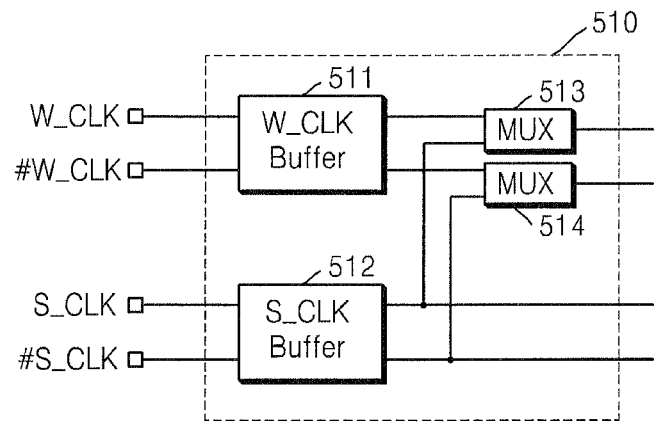
FIGS. 8A and 8B are block diagrams illustrating configurations of a memory device according to other embodiments of the inventive concept.
Figure 8B:
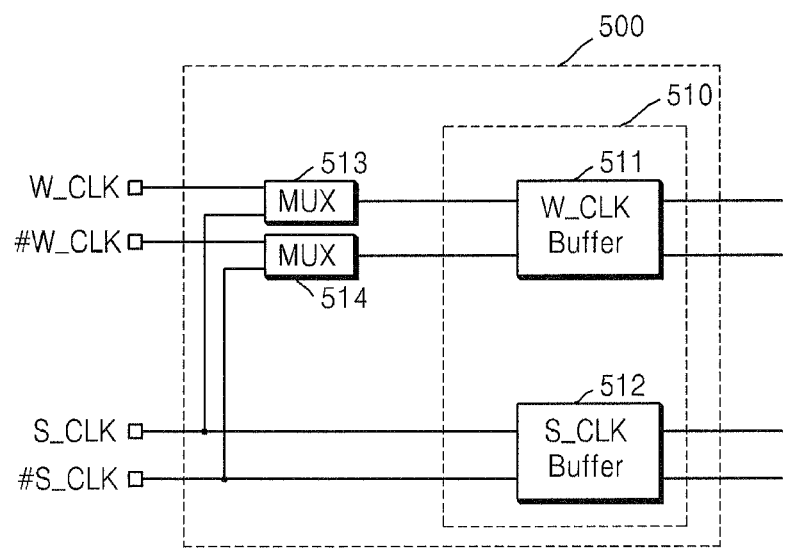

FIGS. 8A and 8B are block diagrams illustrating configurations of a memory device 510 according to other embodiments of the inventive concept. The memory device 510 and a memory module 500 illustrated in FIGS. 8A and 8B are generally similar to those in FIGS. 7A and 7B. FIGS. 8A and 8B illustrate a case where any one of write clock signals W_CLK and #W_CLK and system clock signals S_CLK and #S_CLK is selectively used as clock signals for receiving write data. As described above, the write clock signals W_CLK and #W_CLK may be free-running clock signals selectively activated for a predetermined period of time.

Referring to FIG. 8A, a write clock signal buffer 511 and a system clock signal buffer 512 included in the memory device 510 respectively store write clock signals W_CLK and #W_CLK and system clock signals S_CLK and #S_CLK. Multiplexers 513 and 514 receive the write clock signals W_CLK and #W_CLK and the system clock signals S_CLK and #S_CLK, and selectively output any one of the clock signals. The memory device 510 receives write data in synchronization with the selected clock signals.

Also, referring to FIG. 8B, the multiplexers 513 and 514 may be located outside the memory device 510. The multiplexers 513 and 514 select any one of the clock signals, and provide the selected clock signals to the write clock signal buffer 511. Also, the memory device 510 receives write data in synchronization with the selected clock signals.

Figure 9:
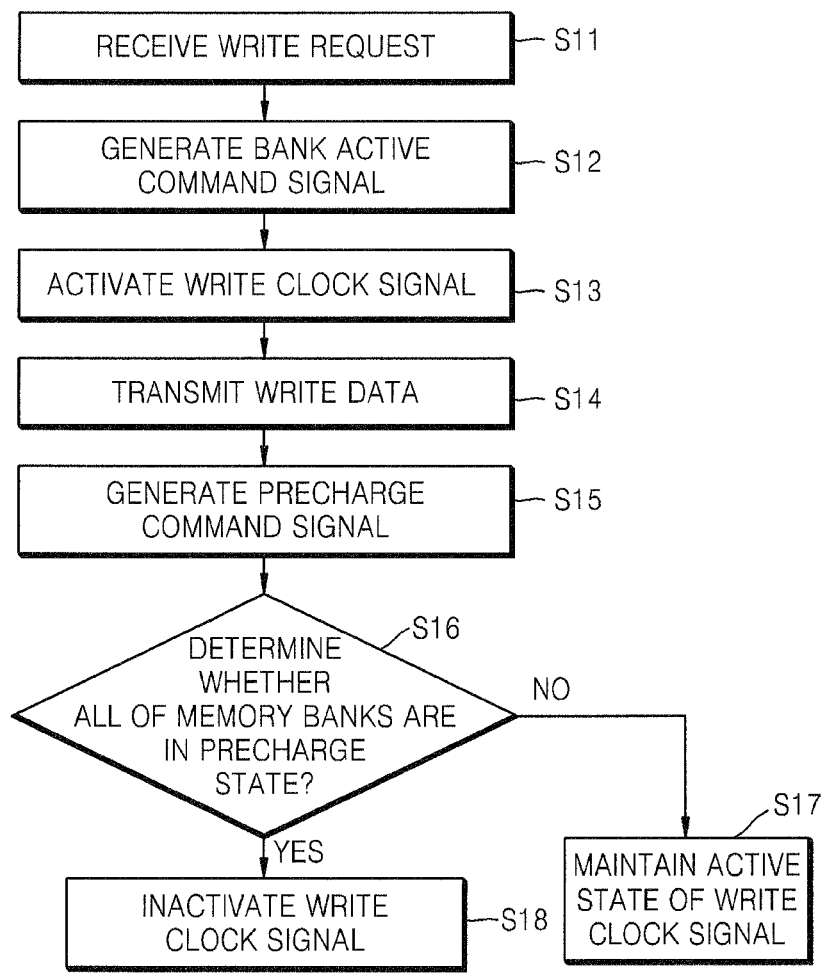
FIG. 9 is a flowchart illustrating a method of operating a memory controller, according to an embodiment of the inventive concept.

FIG. 9 is a flowchart illustrating a method of operating a memory controller according to an embodiment of the inventive concept. Referring to FIG. 9, in operation S11, the memory controller receives a write request from an external host. The memory controller generates various command signals, an address signal, and data for writing data to a memory device, in response to the write request.

In operation S12, a first command signal, for example, a bank active command signal, is generated from among the various command signals generated from the memory controller. In operation S13, the memory controller activates a write clock signal in synchronization with the first command signal. The write clock signal is a free-running clock signal selectively activated for a predetermined period of time, and a start point of the predetermined period of time coincides with a time when the first command signal is generated. In operation S14, the memory controller provides a write command signal and an address signal in addition to the first command signal to the memory device, and also provides write data to the memory device. Since the write clock signal is maintained in an active state while the write data is provided to the memory device, the memory device receives the write data in synchronization with the write clock signal.

In operation S15, if a write operation of the memory device is finished as the write clock signal and the write data are transmitted, a second command signal, e.g., a precharge command signal, is generated and is provided to the memory device. The memory controller may inactivate the write clock signal in response to the second command signal.

Meanwhile, the memory device may include a plurality of memory banks, and the memory controller may inactivate the write clock signal if all of the plurality of memory banks are in a precharge state. In FIG. 9, an operation of determining whether all of the memory banks are in a precharge state is further included. Referring to FIG. 9, in operation S16, it is determined whether all of the memory banks are in a precharge state when the precharge command signal is generated. If it is determined in operation S16 that at least one memory bank is in an active state, the method proceeds to operation S17. In operation S17, the memory controller maintains an active state of the write clock signal.

Otherwise, if it is determined in operation S16 that all of the memory banks are in a precharge state, the method proceeds to operation S18. In operation S18, the memory controller inactivates the write clock signal. That is, if the write operation on all of the memory banks is finished and all of the memory banks are in a precharge state, the write clock signal for transmitting the write data is inactivated, thereby preventing unnecessary power consumption.

As described above, according to the inventive concept, since a data signal is transmitted between a memory device and a memory controller in synchronization with an improved clock signal, power consumption may be reduced and data transmission characteristics may be improved.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims.

What is claimed is:

1. A memory device having a plurality of memory banks of memory cells, comprising:
    a first clock receiver that receives a first external clock from a memory controller and outputs a first internal clock for clocking commands; and
    a second clock receiver that receives a second external clock from the memory controller and outputs a second internal clock for clocking data,
    wherein the second external clock is activated based upon a first command, and
    wherein, upon a determination that all of the memory banks are in a precharge state, the second external clock is deactivated based upon a second command.

2. The device of claim 1, wherein the first command is a memory access command.

3. The device of claim 2, wherein the memory access command is one of Active, Bank Active, Write, or Read.

4. The device of claim 1, wherein the second command is Precharge.

5. The device of claim 1, further including a clock activation circuit configured to generate an enable signal based upon the first command and a disable signal based upon the second command.

6. The device of claim 5, further including a clock generator configured to generate the second clock based upon a system clock upon receipt of the enable signal by the clock generator.

7. The device of claim 6, wherein the clock generator disables the second clock upon receipt of the disable signal by the clock generator.

8. The device of claim 6, wherein the second clock is a passed-through version of the system clock.

9. The device of claim 1, wherein the memory device is a DRAM.

10. A memory device operating method, the memory device having a plurality of memory banks, the operating method comprising:
    receiving a first clock from a memory controller and outputting a first internal clock;
    receiving at a clock activation circuit a memory access command and generating an enable signal based upon the memory access command;
    generating a second clock based upon the first internal clock for clocking data based upon the enable signal and outputting the second clock to the memory controller; and
    upon a determination that all of the memory banks are in a precharge state, generating a disable signal by the clock activation circuit to disable the second clock upon receipt of a Precharge command.

11. The method of claim 10, wherein the memory access command is one of Active, Bank Active, Write, or Read.

12. The method of claim 10, wherein said generating a second clock step is performed within a memory controller.

13. The method of claim 10, wherein said generating a second clock step is performed within a memory device.

14. The method of claim 10, wherein the second clock is a passed-through version of the first clock.

* * * * *